(12) United States Patent
Long et al.

(10) Patent No.: US 9,947,697 B2
(45) Date of Patent: Apr. 17, 2018

(54) LOW TEMPERATURE POLYCRYSTALLINE SILICON TFT ARRAY SUBSTRATE AND METHOD OF PRODUCING THE SAME, DISPLAY APPARATUS

(71) Applicant: BOE Technology Group Co., Ltd., Beijing (CN)

(72) Inventors: Chunping Long, Beijing (CN); Yinan Liang, Beijing (CN); Zheng Liu, Beijing (CN); Zuqiang Wang, Beijing (CN); Xueyan Tian, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 260 days.

(21) Appl. No.: 14/769,891

(22) PCT Filed: Sep. 30, 2014

(86) PCT No.: PCT/CN2014/087893
§ 371 (c)(1),
(2) Date: Aug. 24, 2015

(87) PCT Pub. No.: WO2016/000336
PCT Pub. Date: Jan. 7, 2016

(65) Prior Publication Data
US 2016/0268319 A1 Sep. 15, 2016

(30) Foreign Application Priority Data

Jun. 30, 2014 (CN) .......................... 2014 1 0305758

(51) Int. Cl.
*H01L 27/12* (2006.01)
*H01L 27/32* (2006.01)

(52) U.S. Cl.
CPC ...... *H01L 27/1288* (2013.01); *H01L 27/1255* (2013.01); *H01L 27/3262* (2013.01); *H01L 2227/323* (2013.01)

(58) Field of Classification Search
CPC ............. H01L 27/1255; H01L 27/1288; H01L 27/3262
See application file for complete search history.

(56) References Cited

U.S. PATENT DOCUMENTS 6,703,266 B1  3/2004  Chen et al.
6,787,405 B2  9/2004  Chen
(Continued)

FOREIGN PATENT DOCUMENTS

CN  1622337 A  6/2005
CN  101083261 A  12/2007
(Continued)

OTHER PUBLICATIONS

First Office Action, including Search Report, for Chinese Patent Application No. 201410305758.6, dated May 5, 2016, 7 pages.
(Continued)

*Primary Examiner* — Thao X Le
*Assistant Examiner* — Geoffrey Ida
(74) *Attorney, Agent, or Firm* — Westman, Champlin & Koehler, P.A.

(57) ABSTRACT

The present disclosure provides a low temperature polycrystalline silicon field effect TFT array substrate and a method for producing the same and a display apparatus. The method: using a stepped photo resist process to form a polycrystalline silicon active layer and a lower polar plate of a polycrystalline silicon storage capacitor simultaneously on a substrate in one lithographic process; forming a gate insulation layer on the polycrystalline silicon active layer and the lower polar plate of the polycrystalline silicon storage capacitor;
(Continued)

forming a metal layer on the gate insulation layer and etching the metal layer to form a gate electrode and gate lines connected with the gate electrode, a source electrode, a drain electrode and data lines connected with the source electrode and the drain electrode; forming a passivation layer, a photo resist layer and a pixel electrode layer in sequence and patterning the passivation layer, the photo resist layer and the pixel electrode layer to form patterns of an interlayer insulation layer via hole and a pixel electrode in one lithographic process; forming a pixel definition layer on the pixel electrode. The present disclosure may reduce times of lithographic processes for the low temperature polycrystalline silicon field effect TFT array substrate, improve the yield and reduce the costs.

11 Claims, 6 Drawing Sheets

(56) References Cited

U.S. PATENT DOCUMENTS

| 2002/0001777 | A1 | 1/2002 | Kido |
| 2004/0099863 | A1 | 5/2004 | Chen |
| 2004/0197967 | A1 | 10/2004 | Chen |
| 2005/0116231 | A1 | 6/2005 | Kang et al. |
| 2005/0202601 | A1* | 9/2005 | Koide ............... H01L 27/1259 438/149 |
| 2007/0254415 | A1 | 11/2007 | Oh et al. |
| 2007/0298554 | A1 | 12/2007 | Long et al. |
| 2008/0233665 | A1 | 9/2008 | Jung et al. |
| 2011/0114940 | A1* | 5/2011 | Kim ............... H01L 21/02554 257/43 |
| 2014/0070206 | A1 | 3/2014 | Dai et al. |
| 2016/0181289 | A1 | 6/2016 | Long et al. |

FOREIGN PATENT DOCUMENTS

| CN | 102683338 A | 9/2012 |
| CN | 103107095 A | 5/2013 |
| EP | 2 741 332 A2 | 6/2014 |
| WO | 2015/180320 A1 | 12/2015 |

OTHER PUBLICATIONS

International Search Report and Written Opinion for PCT Application No. PCT/CN2014/087893, dated Mar. 27, 2015, 9 pages.
English translation of Box No. V from the Written Opinion of the International Searching Authority for PCT Application No. PCT/CN2014/087893, 2 pages.
Extended European Search Report for European Patent Application No. 14882781.9, dated Feb. 3, 2017, 9 pages.

* cited by examiner

LOW TEMPERATURE POLYCRYSTALLINE SILICON TFT ARRAY SUBSTRATE AND METHOD OF PRODUCING THE SAME, DISPLAY APPARATUS

CROSS-REFERENCE TO RELATED APPLICATION

This application is a Section 371 National Stage Application of International Application No. PCT/CN2014/087893, filed 30 Sep. 2014, which claims the benefit of Chinese Patent Application No. 201410305758.6 filed on Jun. 30, 2014 in the State Intellectual Property Office of China, titled with "low temperature polycrystalline silicon TFT array substrate and method of producing the same, display apparatus", the whole disclosure of which is incorporated herein by reference.

BACKGROUND

Field of the Disclosure

The present disclosure relates to the technical field of producing an active matrix organic light emitting diode display, and in particular, to a low temperature polycrystalline silicon field effect thin film transistor (TFT) array substrate and a method of producing the same, and a display apparatus including the low temperature polycrystalline silicon field effect thin film transistor array substrate.

Description of the Related Art

In comparison with a liquid crystal display, an organic light emitting diode display has advantages of high response speed, low weight, flexibility and wide visual angle. Further, an active matrix organic light emitting diode (AMOLED) has advantages of small driving current and low power consumption and thus is suitable for a high resolution display. Architecture of the active matrix organic light emitting diode may be driven by amorphous silicon, polycrystalline silicon, oxide semiconductor or organic thin film transistor. In an example, the amorphous silicon or the organic thin film transistor has low carrier mobility and low driving current, and thus the voltage required for driving high brightness organic light emitting diodes becomes high and its device also has a large dimension. The low temperature polycrystalline silicon has the mobility of up to 100 $cm^2/V \cdot s$. Its high current characteristics just conform to strict requirements for the organic light emitting diodes. The organic light emitting diode has a long lifetime due to its low operation voltage and high density driving architecture. Distinguished from the voltage driving mode of the conventional liquid crystal display, the current driving architecture required for driving the organic light emitting diodes is special and a compensation circuit for improving the uniformity of the gray scales and panel is also needed. And 2~6 thin film transistors are often needed in one pixel. The high density layout of the low temperature polycrystalline silicon allows the organic light emitting diode panel with high brightness and high display quality to be produced more easily. Currently, most of the commercially available AMOLEDs use the low temperature polycrystalline silicon field effect thin film transistor array substrate.

FIG. 1 is a schematic view of the conventional low temperature polycrystalline silicon field effect thin film transistor array substrate. In the conventional process for producing the low temperature polycrystalline silicon field effect thin film transistor array substrate, typically 8-9 patterning processes are needed, causing the production process to become more complex. With reference to FIGS. 2A~2G, the conventional process for producing the low temperature polycrystalline silicon field effect thin film transistor array substrate shown in FIG. 1 will be explained below.

As illustrated in FIG. 2A, a silicon nitride (SiN) film and a silicon dioxide ($SiO_2$) film are deposited sequentially on an entire insulation substrate 1 by plasma enhanced chemical vapor deposition (PECVD), to form a buffer layer 2 composed of the silicon nitride and the silicon dioxide. Next, an amorphous silicon (α-Si) film is formed on the buffer layer 2 by PECVD or other chemical or physical vapor deposition processes. By means of Excimer Laser Annealing (ELA) or solid phase crystallization (SPC), the α-Si may be crystallized into a polycrystalline silicon film. Then, a pattern in a layer of photo resist is formed on the polycrystalline silicon film by the conventional patterning process. With the layer of photo resist used as an etching barrier layer, the portion of the polycrystalline silicon film that is not shielded is etched by plasma to form a polycrystalline silicon active layer 4 and a polycrystalline silicon storage capacitor 3. Low concentration ion implantation is carried out in the transistor channel in the polycrystalline silicon active layer 4 by ion implantation process, so as to form a conductive channel required for the thin film transistor in the polycrystalline silicon active layer 4.

As illustrated in FIG. 2B, a layer of photo resist 5 composed of photo resist material is formed on the polycrystalline silicon active layer 4 by a patterning process, so as to protect the polycrystalline silicon active layer 4 from being implanted with ions. The polycrystalline silicon storage capacitor 3 that is not protected by the layer of photo resist is implanted with high concentration ions. In this way, the polycrystalline silicon storage capacitor 3 is converted into low resistance doped polycrystalline silicon film. During the subsequent processes as shown in FIGS. 2C-2G, as a second polar plate of a capacitor composed of a gate insulation layer and a gate metal film is only formed on the polycrystalline silicon storage capacitor 3, FIGS. 2C-2G do not show a single lithographic process after the polycrystalline silicon storage capacitor 3 is formed, i.e., the lithographic process for forming the second polar plate of the capacitor 3, any longer.

As illustrated in FIG. 2C, the layer of photo resist 5 on the polycrystalline silicon active layer 4 is removed by a photo resist peeling process, a $SiO_2$ film or a composite film of $SiO_2$ and SiN is deposited by PECVD and the gate insulation layer 6 is formed on the polycrystalline silicon storage capacitor 3, the polycrystalline silicon active layer 4 and the entire buffer layer 2. One or more low resistance metal material film is deposited on the gate insulation layer 6 by physical vapor deposition process such as magnetron sputtering, and a gate electrode 7 is formed by a lithographic process. The gate electrode 7 is used as an ion implantation barrier layer to dope the polycrystalline silicon active layer 4 with ions and thus to form low resistance source electrode and drain electrode contact areas on the polycrystalline silicon active layer area that is not blocked by the gate electrode.

As illustrated in FIG. 2D, on the entire surface including the gate electrode 7, the $SiO_2$ film and the SiN film are deposited sequentially by PECVD to form an interlayer insulation layer 8. The interlayer insulation layer 8 is etched by patterning and etching processes to form a source electrode contact hole 15 and a drain electrode contact hole 16.

As illustrated in FIG. 2E, one or more low resistance metal film is deposited by magnetron sputtering on the interlayer insulation layer 8 and the source electrode contact hole 15 and the drain electrode contact hole 16. A source electrode 9 and a drain electrode 10 are formed by patterning and etching processes. The source electrode 9 and the drain electrode 10 comes in ohm contact with the polycrystalline silicon active layer 4 through the contact holes 15, 16. The doping ions in the polycrystalline silicon active layer 4 are activated by rapid thermal annealing or heat treatment furnace annealing to form an efficient conductive channel in the polycrystalline silicon active layer 4 under the gate electrode 7.

As illustrated in FIG. 2F, a layer of SiN film is deposited on an entire surface including the source electrode 9 and the drain electrode 10 by PECVD and a passivation layer 11 including a via hole 17 is formed by patterning and etching processes. By means of hydrogenation process by rapid thermal annealing or heat treatment furnace annealing, the defects in the interior and the interface of the polycrystalline silicon active layer 4 can be repaired. Again, by the patterning process, an organic planarization layer 18 with the same via hole as the via hole 17 is formed above the SiN passivation layer 11 to fill recesses on the surface of a device to form a planar surface.

As illustrated in FIG. 2G, a layer of transparent conductive film is deposited above the organic planarization layer 18 and the via hole 17 by magnetron sputtering and the transparent conductive film is etched by a lithographic process to form a pixel electrode 12 in a pixel area above the via hole 17 and a part of the organic planarization layer 18. Then, a layer of photo sensitive organic material similar to the organic planarization layer 18 is coated on the organic planarization layer 18 and the pixel electrode 12. Partial area of the pixel electrode 12 is exposed by the last patterning process to form a pixel definition layer 13 shown in FIG. 1. The pixel definition layer 13 covers the organic planarization layer 18 and the partial area of the pixel electrode 12.

As discussed above, the low temperature polycrystalline silicon field effect thin film transistor array substrate shown in FIG. 1 is formed by at least 8-9 lithographic processes, including forming the polycrystalline silicon active layer, the doping storage capacitor, the gate electrode, the interlayer insulation layer contact hole, the source electrode and the drain electrode, the passivation layer via hole, the planarization layer, the pixel electrode and the pixel definition layer respectively by lithographic processes. It will cause a long process time and a low yield. In this way, the production process becomes complex and the production cost becomes high.

SUMMARY OF THE DISCLOSURE

In view of this, an object of the present disclosure provides a low temperature polycrystalline silicon field effect thin film transistor array substrate and a method for producing the same, so as to reduce the times (i.e., the number) of lithographic processes for producing the low temperature polycrystalline silicon field effect thin film transistor array substrate to improve the yield and reduce the costs.

Another object of the present disclosure provides a display apparatus comprising the low temperature polycrystalline silicon field effect thin film transistor array substrate.

According to an aspect of the present disclosure, it provides a method for producing a low temperature polycrystalline silicon field effect thin film transistor array substrate, comprising the steps of:

a) using a stepped photo resist process to form a polycrystalline silicon active layer and a lower polar plate of a polycrystalline silicon storage capacitor simultaneously on a substrate in one lithographic process;

b) forming a gate insulation layer on the polycrystalline silicon active layer and the lower polar plate of the polycrystalline silicon storage capacitor;

c) forming a metal layer on the gate insulation layer and etching the metal layer to form a gate electrode and gate lines connected with the gate electrode, a source electrode, a drain electrode and data lines connected with the source electrode and the drain electrode;

d) forming a passivation layer, a photo resist layer and a pixel electrode layer in sequence on the etched metal layer and using stepped patterning and peeling processes to pattern the passivation layer, the photo resist layer and the pixel electrode layer to form patterns of an interlayer insulation layer via hole and a pixel electrode in one lithographic process;

e) forming a pixel definition layer on the pixel electrode to finalize the production of the low temperature polycrystalline silicon field effect thin film transistor array substrate.

Preferably, the step a) comprises: cleaning the substrate to deposit a layer of SiN film and a layer of SiO2 film sequentially on a surface of the substrate, the SiN film and the SiO2 film constituting a buffer layer; depositing a layer of amorphous silicon film on the buffer layer, dehydrogenating the amorphous silicon film and crystallizing the amorphous silicon film to form the polycrystalline silicon film; cleaning the polycrystalline silicon film and using a semi-transparent mask to form a first layer of photo resist and a second layer of photo resist with different thicknesses on the surface of the polycrystalline silicon film, the thickness of the first layer of photo resist being greater than that of the second layer of photo resist; etching the polycrystalline silicon film to form a film used for constituting the polycrystalline silicon active layer and a film used for constituting the lower polar plate of the polycrystalline silicon storage capacitor, and then removing the second layer of photo resist while remaining the first layer of photo resist as an ion-implantation barrier layer to dope the film used for constituting the lower polar plate of the polycrystalline silicon storage capacitor with ions, and then removing the first layer of photo resist so as to form the polycrystalline silicon active layer and the lower polar plate of the polycrystalline silicon storage capacitor simultaneously on the substrate.

Preferably, the SiN film and the SiO2 film constituting the buffer layer have a thickness of 50 nm~100 nm and a thickness of 100 nm~400 nm respectively; the amorphous silicon film deposited on the buffer layer has a thickness of 40 nm~100 nm; the amorphous silicon film is dehydrogenated by a heat treatment furnace to prevent the hydrogen explosion in crystallization; the amorphous silicon film is crystallized by laser annealing crystallization, metal induced crystallization or solid phase crystallization; wherein the semi-transparent mask is a half-tone or gray-tone mask; the first layer of photo resist has a thickness of 1~3 micrometers and covers a region of the polycrystalline silicon film forming the polycrystalline silicon active layer; and the second layer of photo resist has a thickness of 0.5~1 micrometer and covers a region of the polycrystalline silicon film forming the lower polar plate of the polycrystalline silicon storage capacitor; etching the polycrystalline silicon film by a plasma process or an inductance coupling plasma process; removing the second layer of photo resist by a plasma ashing process while remaining the first layer of photo resist as the ion-implantation barrier layer; doping the film used for constituting the lower polar plate of the polycrystalline silicon storage capacitor with ions by an ion implantation process or an ion cloud implantation process, wherein the doping ions are PH3/H2 or B2H6/H2, with an ion implantation dose of 1014 ions/cm2~1016 ions/cm2 and an ion implantation energy of 10 KeV~100 KeV.

Preferably, in the step b), the gate insulation layer is formed on the polycrystalline silicon active layer and the lower polar plate of the polycrystalline storage capacitor by a plasma enhanced chemical vapor deposition (PECVD) process, the gate insulation layer being composed of the SiO2 film and the SiN film formed above the SiO2 film, the SiO2 film having a thickness of 30 nm~100 nm and the SiN film having a thickness of 20 nm~100 nm. The gate insulation layer deposited on the lower polar plate of the polycrystalline silicon storage capacitor is configured to constitute an insulation medium of the polycrystalline storage capacitor.

Preferably, in the step c), the step of forming the metal layer on the gate insulation layer comprises depositing a layer of metal film with a thickness of 200 nm~500 nm on the gate insulation layer by a magnetron sputtering process, and then removing the portion of the metal film in the region other than the gate electrode, the gate lines, the source electrode, the drain electrode and data lines by lithographic and etching processes to form the gate electrode and the gate lines connected with the gate electrode, the source electrode, the drain electrode and data lines connected with the source electrode and the drain electrode, and at the same time to form an upper polar plate of the polycrystalline silicon storage capacitor.

Preferably, the metal film is a single-layer metal film composed of Al, Cu, Mo, Ti or AlNd, or a multi-layer metal film composed of Mo/Al/Mo or Ti/Al/Ti; the data lines connected with the source electrode and the drain electrode are formed by continuous line-shaped metal films, the gate lines are formed by discontinuous line-shaped metal films, and the gate lines are interrupted at crossings of them with the data lines; the step of etching the metal layer is performed by wet or dry eroding process; the lower polar plate of the polycrystalline silicon storage capacitor, the gate insulation layer formed on the lower polar plate of the polycrystalline silicon storage capacitor and the upper polar plate of the polycrystalline silicon storage capacitor constitute the polycrystalline silicon storage capacitor.

Preferably, the step d) comprises: depositing a layer of medium film on the gate electrode, the source electrode, the drain electrode and the metal gate lines and the data lines by PECVD to form the passivation layer, and then performing a rapid thermal annealing process or a heat treatment furnace annealing process to hydrogenate the interior of the polycrystalline silicon active layer and the interface between the polycrystalline silicon film and the SiO2 film by means of the SiN film in the gate insulation layer and the passivation layer; forming a third layer of photo resist and a fourth layer of photo resist with different thicknesses on a surface of the passivation layer by means of the semi-transparent mask, the thickness of the third layer of photo resist being greater than that of the fourth layer of photo resist; etching the passivation layer and the gate insulation layer under the passivation layer by a plasma process or an inductance coupling plasma process to form a passivation layer via hole; removing the fourth layer of photo resist while remaining the third layer of photo resist as a peeling layer; depositing a layer of transparent conductive film on the passivation layer via hole, the third layer of the photo resist, the passivation layer, the source electrode, the drain electrode and an entire surface of the substrate; and removing the third layer of photo resist and the transparent conductive film deposited on it together by a peeling process while remaining the passivation layer via hole and the transparent conductive film above the passivation layer film in a source electrode area, a drain electrode area and a pixel area to form the source electrode and the pixel electrode.

Preferably, the passivation layer is a hydrogen-containing SiN film with a thickness of 200 nm~500 nm; the semi-transparent mask is a half-tone or gray-tone mask; the third layer of photo resist has a thickness of 1~3 micrometers and covers the gate electrode and the gate lines connected with it, the source electrode and data lines connected with the source electrode and the whole region other than the passivation layer via hole and the fourth layer of photo resist; the fourth layer of photo resist has a thickness of 0.5~1 micrometer and covers the drain electrode and adjacent pixel areas; when the low temperature polycrystalline silicon field effect thin film transistor array uses bottom-emitting active matrix organic light emitting diodes (AMOLED), the transparent conductive film deposited on the passivation layer via hole, the third layer of photo resist, the passivation layer, the source electrode, the drain electrode and an entire surface of the substrate is an oxide transparent conductive film, at least comprising Indium tin oxide, Indium zinc oxide or Tin aluminum oxide, with a thickness of 20 nm~100 nm; when the low temperature polycrystalline silicon field effect thin film transistor array uses top-emitting AMOLEDs, the transparent conductive film deposited on the passivation layer via hole, the third layer of photo resist, the passivation layer, the source electrode, the drain electrode and an entire surface of the substrate is a composite film, at least comprising ITO/Ag/ITO and IZO/Ag, wherein the ITO has a thickness of 10 nm~50 nm and the Ag metal film has a thickness of 20 nm~100 nm.

Preferably, forming a conductive film connecting discontinuous gate lines at bridges for the discontinuous gate lines while performing the passivation layer via hole process, the conductive film deposition and peeling process to finalize the production of the data lines in the entire array; the passivation layer via hole process at the gate lines and the passivation layer via hole process at the source and drain electrodes are performed simultaneously, the deposition and peeling process of the gate line connection conductive film and the deposition and peeling process of the pixel electrode are also performed simultaneously.

Preferably, in the step e), the pixel definition layer formed on the pixel electrode is formed by acrylic materials with a thickness of 1~4 micrometers. The step e) comprises: after forming the pixel definition layer on the pixel electrode, further annealing the low temperature polycrystalline silicon field effect thin film transistor array substrate by rapid thermal annealing or heat treatment furnace annealing to stabilize the characteristics of the low temperature polycrystalline silicon field effect thin film transistor.

According to another aspect of the present disclosure, it also provides a low temperature polycrystalline silicon field effect thin film transistor array substrate produced by the method as described above.

Preferably, the gate electrode, the source electrode and the drain electrode are produced by the same layer of metal in the low temperature polycrystalline silicon field effect thin film transistor.

Preferably, in the low temperature polycrystalline silicon field effect thin film transistor, the same layer of transparent conductive film configured to deposit the pixel electrode connects the respective gate lines through via holes together.

Preferably, in the low temperature polycrystalline silicon field effect thin film transistor, the same layer of transparent conductive film configured to deposit the pixel electrode connects the drain electrode with the active layer together.

According to a further aspect of the present disclosure, it also provides a display apparatus comprising the low temperature polycrystalline silicon field effect thin film transistor array substrate as described above.

Figure 1:
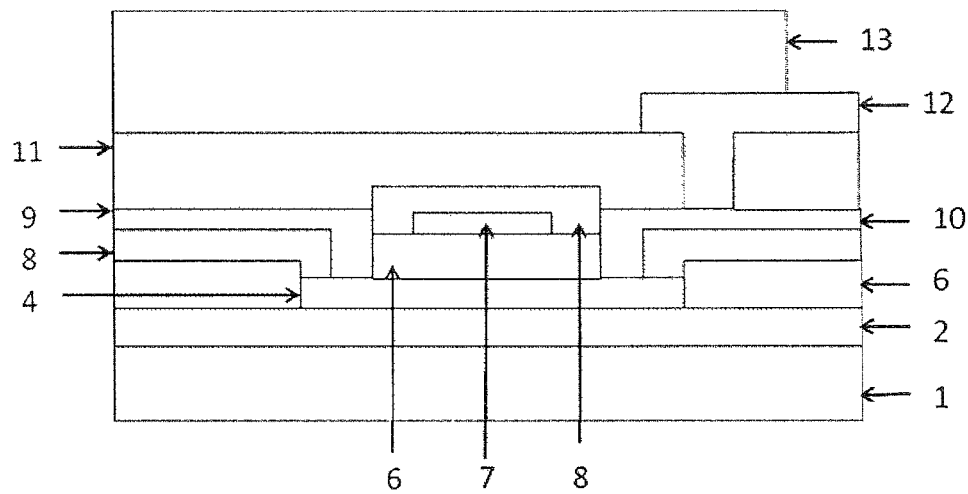
FIG. 1 schematically shows the conventional low temperature polycrystalline silicon field effect thin film transistor array substrate.
Figure 2A:
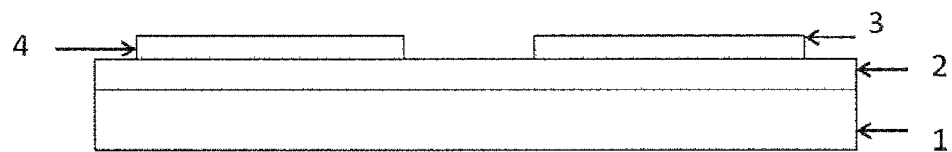
FIGS. 2A~2G are process flow charts of the conventional process for producing the low temperature polycrystalline silicon field effect thin film transistor array substrate shown in FIG. 1.
Figure 2B:
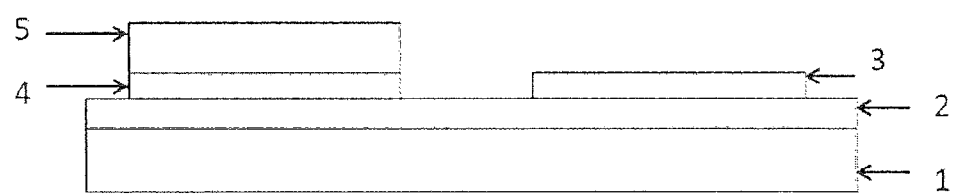
Figure 2C:
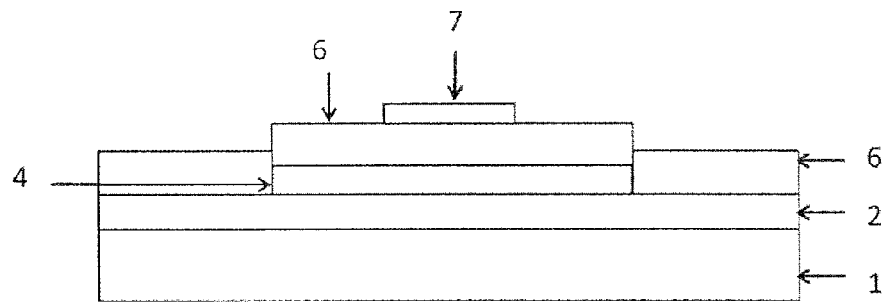
Figure 2D:
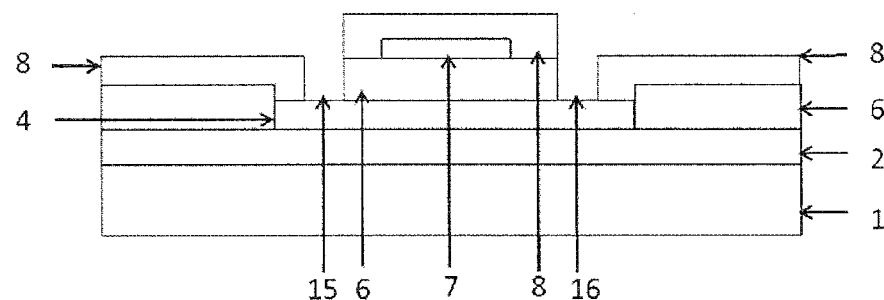
Figure 2E:
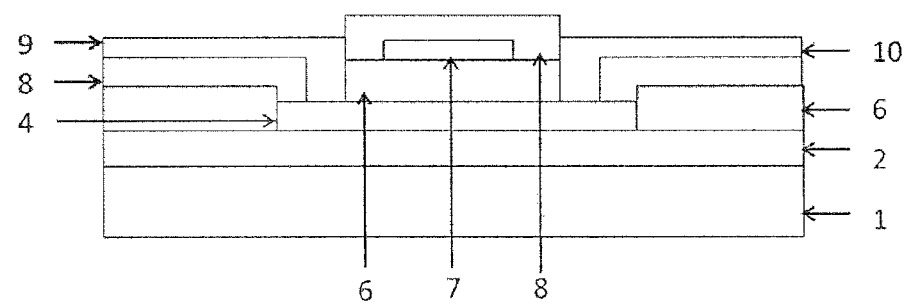
Figure 2F:
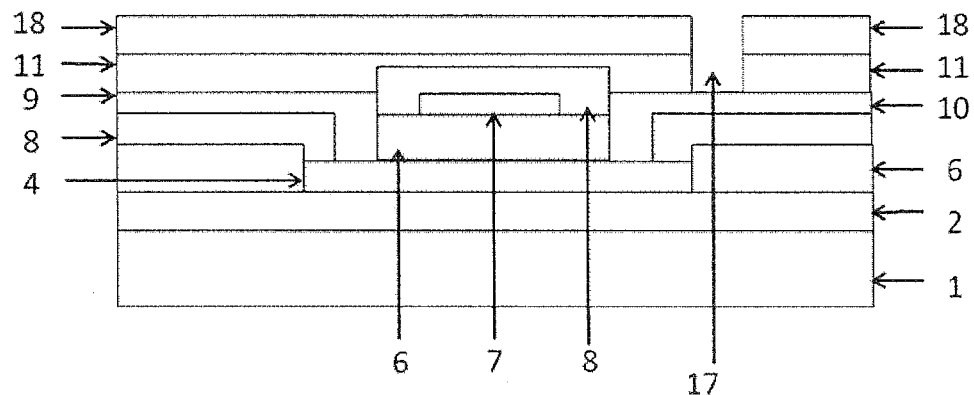
Figure 2G:
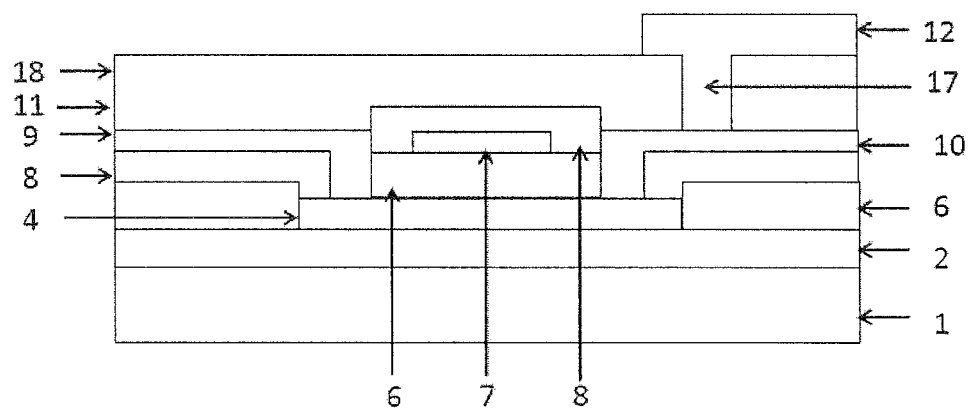

Reference Numerals: 1. Substrate; 2. Buffer layer; 3. Polycrystalline silicon storage capacitor; 4. Polycrystalline silicon active layer; 5. Photo resist; 5a, 5c. Full thickness photo resist; 5b, 5d. Half thickness photo resist; 6. Gate insulation layer; 7. Gate electrode; 7a. Gate line; 8. Interlayer insulation layer; 9. Source electrode; 9a. Source contact electrode; 9b. data line; 10. Drain electrode; 11. Passivation layer; 12. Pixel electrode; 12a. Residual pixel electrode film (Transparent conductive film); 13. Pixel definition layer; 14. Gate line connecting conductive film; 15. Source electrode contact hole; 16. Drain electrode contact hole; 17. Via hole; 18. Organic planarization layer; 19. Polycrystalline silicon film; 20. Passivation layer via hole.

DETAILED DESCRIPTION OF THE PREFERRED EMBODIMENTS

In order that objects, solutions and advantages of the present disclosure will become more apparent and explicit, the embodiments of the present disclosure will be described hereinafter in detail with reference to the accompanied drawings.

According to an aspect of the present disclosure, in order to reduce the number of lithographic processes in a method for producing a low temperature polycrystalline silicon field effect thin film transistor array substrate, the disclosure provides a method for producing a low temperature polycrystalline silicon field effect thin film transistor array substrate. The method uses three processing techniques, that is, a semi-transparent mask patterning process, a film peeling process and a process of depositing a gate electrode (gate lines) and a source electrode, and a drain electrode (data lines) in the same layer. In this way, the number of the lithographic processes for producing the low temperature polycrystalline silicon field effect thin film transistor array substrate is reduced such that only 4 lithographic processes are used in the production. In the lithographic process of the polycrystalline silicon film, two photo resist films with different thicknesses are formed by the semi-transparent mask patterning process. At first, a polycrystalline silicon is etched to form the polycrystalline silicon active layer and the polycrystalline silicon storage capacitor; then the thinner one of the photo resist films is removed while remaining the thicker one of the photo resist films as the ion-implantation barrier layer of the polycrystalline silicon active layer. Then, ion-implantation is performed to form the polycrystalline silicon storage capacitor. In this way, two lithographic processes in the prior art, i.e., etching the polycrystalline silicon and doping the storage capacitor with ions are combined into one process. A layer of metal film is deposited on the gate insulation film and the gate electrode/gate lines and the source electrode and drain electrode/data lines are formed simultaneously in one lithographic process. The two lithographic processes in the prior art, i.e., patterning the gate electrode and patterning the drain electrode and the source electrode are reduced into one lithographic process. In a lithographic process of the passivation layer via hole, two photo resist films with different thicknesses are formed by the semi-transparent mask patterning process. At first, the passivation layer via hole is formed by an etching process. Then, the thinner one of the photo resist films in the pixel area is removed and a layer of transparent conductive film is deposited. The thicker one of the photo resist films and the transparent conductive film formed thereon are removed by the film peeling process to form the pixel electrode. Thus, the two lithographic processes in the prior art, i.e., patterning the passivation layer via hole and patterning the pixel electrode, are combined into one process. The last lithographic process forms the pixel definition layer. The resultant low temperature polycrystalline silicon field effect thin film transistor array substrate may be used to produce AMOLED.

Figure 3:
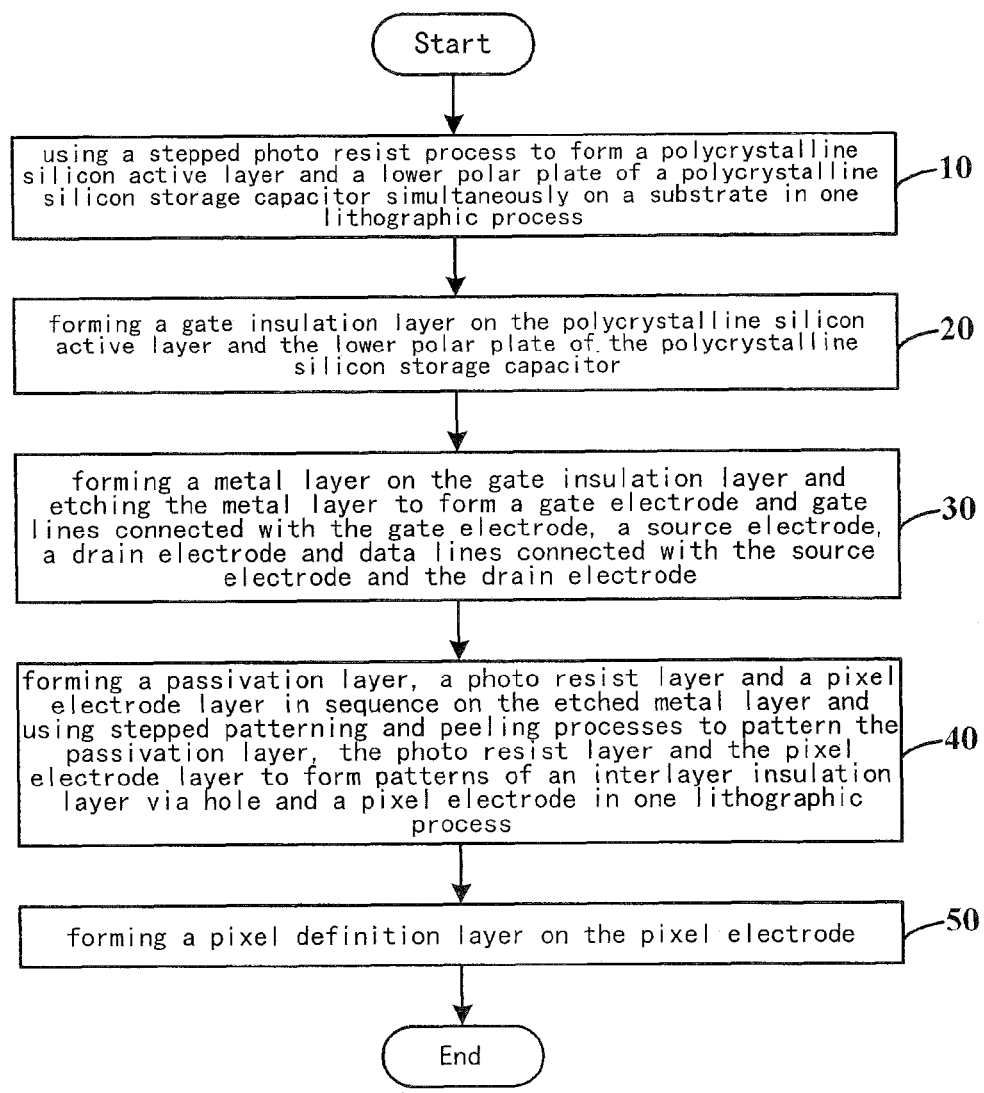
FIG. 3 is a flow chart of a method for producing the low temperature polycrystalline silicon field effect thin film transistor array substrate provided by the present disclosure.

As illustrated in FIG. 3, it shows a flow chart of a method for producing a low temperature polycrystalline silicon field effect thin film transistor array substrate provided by the present disclosure. The method includes the following steps:

Step 10: using a stepped photo resist process to form a polycrystalline silicon active layer and a lower polar plate of a polycrystalline silicon storage capacitor simultaneously on a substrate in one lithographic process;

Step 20: forming a gate insulation layer on the polycrystalline silicon active layer and the lower polar plate of the polycrystalline silicon storage capacitor;

Step 30: forming a metal layer on the gate insulation layer and etching the metal layer to form a gate electrode and gate lines connected with the gate electrode, a source electrode, a drain electrode and data lines connected with the source electrode and the drain electrode;

Step 40: forming a passivation layer, a photo resist layer and a pixel electrode layer in sequence on the etched metal layer and using stepped patterning and peeling processes to pattern the passivation layer, the photo resist layer and the pixel electrode layer to form patterns of an interlayer insulation layer via hole and a pixel electrode in one lithographic process;

Step 50: forming a pixel definition layer on the pixel electrode to finalize the production of the low temperature polycrystalline silicon field effect thin film transistor array substrate.

On the basis of the flow chart of the method for producing the low temperature polycrystalline silicon field effect thin film transistor array substrate shown in FIG. 3, the process for producing the low temperature polycrystalline silicon field effect thin film transistor array substrate according to an embodiment of the present disclosure will be explained below in details with reference to FIGS. 4A-4H.

Figure 4A:
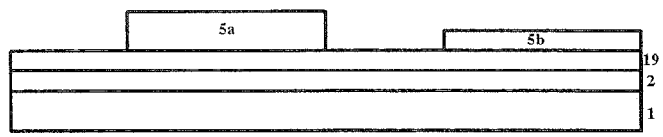
FIGS. 4A~4H are process flow charts of a process for producing the low temperature polycrystalline silicon field effect thin film transistor array substrate according to an embodiment of the present disclosure.

As illustrated in FIG. 4A, a substrate 1 is cleaned initially to remove impurity particles on the surface of the substrate 1, and then a layer of SiN film and a layer of $SiO_2$ film are sequentially deposited on the surface of the substrate by PECVD. The SiN film and the $SiO_2$ film constitute a buffer layer 2. The SiN film has a thickness of 50 nm~100 nm. The $SiO_2$ film has a thickness of 100 nm~400 nm. The SiN film has very strong diffusion barrier characteristics and may suppress effects of metal ions on the polycrystalline silicon film on the buffer layer 2. The $SiO_2$ film and the polycrystalline silicon film have a good interface therebetween, which may prevent the defect of the SiN film from degrading the quality of the polycrystalline silicon film. Next, a layer of amorphous silicon (α-silicon) film with a thickness of 40 nm~100 nm is deposited continuously on the buffer layer 2 by PECVD, and the α-silicon film is dehydrogenated by a heat treatment furnace to prevent hydrogen explosion in crystallization. Then, the α-silicon film is crystallized for example by laser annealing crystallization, metal induced crystallization or solid phase crystallization to form the polycrystalline silicon film 19 as illustrated in FIG. 4A. Next, the polycrystalline silicon film 19 is cleaned by a diluted hydrofluoric acid to reduce the surface roughness of the polycrystalline silicon film 19. Two layers of photo resist with different thicknesses, that is, a first layer of photo resist 5a and a second layer of photo resist 5b are formed on the surface of the polycrystalline silicon film 19 by using a semi-transparent mask. The semi-transparent mask may be a half-tone mask or a gray-tone mask. The first layer of photo resist 5a has a thickness of 1~3 micrometers and covers a region of the polycrystalline silicon film 19 forming the polycrystalline silicon active layer 4. The second layer of photo resist 5b has a thickness of 0.5~1 micrometer and covers a region of the polycrystalline silicon film 19 forming the lower polar plate 3 of the polycrystalline silicon storage capacitor.

Figure 4B:
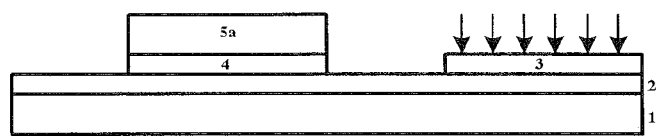

As illustrated in FIG. 4B, the polycrystalline silicon film 19 is etched by plasma or inductive coupling plasma to form a film used for constituting the polycrystalline silicon active layer 4 and a film used for constituting the lower polar plate 3 of the polycrystalline silicon storage capacitor. Then, the second layer of photo resist 5b is removed by plasma ashing process while the first layer of photo resist 5a is remained as an ion-implantation barrier layer. The film used for constituting the lower polar plate 3 of the polycrystalline silicon storage capacitor is doped with ions, by means of ion implantation or ion cloud implantation process. Typically, the doping ions are $PH_3/H_2$ or $B_2H_6/H_2$, with an ion implantation dose of $10^{14}$ ions/$cm^2$~$10^{16}$ ions/$cm^2$ and an ion implantation energy of 10 KeV~100 KeV.

Figure 4C:
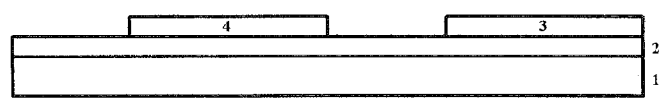

After the ions are implanted, as illustrated in FIG. 4C, the residual first layer of photo resist 5a is removed by a plasma etching machine or a peeling machine to form the polycrystalline silicon active layer 4 and the lower polar plate 3 of the polycrystalline silicon storage capacitor. Then, the rapid thermal annealing process is applied to the polycrystalline silicon active layer 4 to activate the doping ions so as to enhance the conductive characteristics of the polycrystalline silicon active layer 4.

Figure 4D:
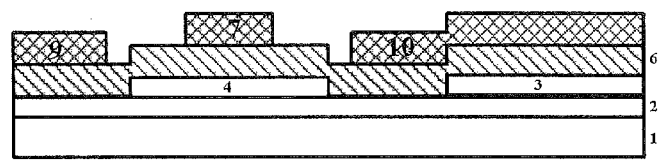

As illustrated in FIG. 4D, a medium film is deposited by PECVD on the polycrystalline silicon active layer 4, the lower polar plate 3 of the polycrystalline silicon storage capacitor and the exposed buffer layer 2 to form a gate insulation layer 6. The gate insulation layer 6 is composed of the $SiO_2$ film and the SiN film formed above the $SiO_2$ film. The $SiO_2$ film has a thickness of 30 nm~100 nm and the SiN film has a thickness of 20 nm~100 nm. The gate insulation layer 6 deposited on the lower polar plate 3 of the polycrystalline silicon storage capacitor is configured to constitute an insulation medium of the polycrystalline storage capacitor. Next, a layer of metal film with a thickness of 200 nm~500 nm is deposited on the gate insulation layer 6 by a magnetron sputtering process. The metal film may be a single-layer metal film composed of Al, Cu, Mo, Ti or AlNd, or may be a multi-layer metal film composed of Mo/Al/Mo or Ti/Al/Ti. Then, the part of the metal film in the region other than the gate electrode, the gate lines, the source electrode, the drain electrode and the data lines is removed by lithographic and etching processes to form the gate electrode 7 and the gate lines (not shown) connected with the gate electrode, the source electrode 9, the drain electrode 10 and data lines (not shown) connected with the source electrode and the drain electrode, as well an upper polar plate of the polycrystalline silicon storage capacitor. The upper polar plate of the polycrystalline silicon storage capacitor, the insulation medium of the polycrystalline silicon storage capacitor and the lower polar plate 3 of the polycrystalline silicon storage capacitor constitute the polycrystalline silicon storage capacitor. The data lines are formed by continuous line-shaped metal films and the gate lines are formed by discontinuous line-shaped metal films and are interrupted at crossings of them with the data lines. The metal etching process may be wet eroding process or dry eroding process, for example, inductive coupling plasma etching process.

Figure 4E:
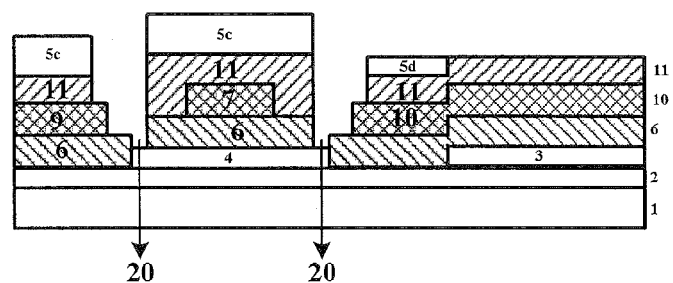

As illustrated in FIG. 4E, a layer of medium film is deposited by PECVD on the gate electrode 7, the source electrode 9, the drain electrode 10, the metal gate lines and the data lines to form a passivation layer 11. The passivation layer 11 typically is a hydrogen-containing SiN film with a thickness of 200 nm~500 nm. Then, the rapid thermal annealing or heat treatment furnace annealing process is performed to hydrogenate the interior of the polycrystalline silicon active layer 4 and the interface between the polycrystalline silicon film and the $SiO_2$ film by means of the SiN film in the gate insulation layer 6 and the passivation layer 11, so as to suppress the defects of the passivation body and the interface to improve the characteristics of the polycrystalline silicon thin film transistor. Two layers of photo resist with different thicknesses, that is, a third layer of photo resist 5c and a fourth layer of photo resist 5d, are formed on a surface of the passivation layer by means of a semi-transparent mask. The semi-transparent mask may be a half-tone mask or a gray-tone mask. The third layer of photo resist 5c has a thickness of 1~3 micrometers and covers the gate electrode 7 and the gate lines connected with it, the source electrode 9 and the data lines connected with the source electrode 9 and all of regions other than the passivation layer via holes 20 and the fourth layer of photo resist 5d. The fourth layer of photo resist 5d has a thickness of 0.5~1 micrometer and covers the drain electrode 10 and the adjacent pixel area. The SiN film is etched by plasma or an inductive coupling plasma process to form the passivation layer via holes 20. The thinner fourth layer of photo resist 5d is removed by a plasma ashing process while retaining the third layer of photo resist 5c as a peeling layer.

Figure 4F:
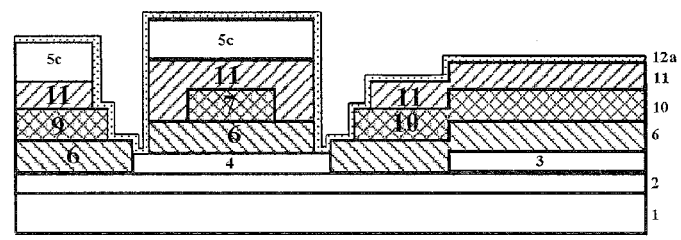

As illustrated in FIG. 4F, a layer of transparent conductive film 12a is deposited by magnetron sputtering on the passivation layer via holes 20, the third layer of photo resist 5c, the passivation layer 11, the source electrode 9, the drain electrode 10 and the entire surface of the substrate. When the low temperature polycrystalline silicon field effect thin film transistor array uses a bottom-emitting AMOLED, the transparent conductive film 12a is typically an oxide transparent conductive film such as indium tin oxide (ITO), indium zinc oxide (IZO), tin aluminum oxide (ZTO), and has a thickness of 20 nm~100 nm. When the low temperature polycrystalline silicon field effect thin film transistor array uses the top-emitting AMOLED, the transparent conductive film 12a is typically a composite film such as ITO/Ag/ITO, IZO/Ag. The ITO film has a thickness of 10 nm~50 nm. The Ag metal film has a thickness of 20 nm~100 nm.

The substrate deposited with the transparent conductive film 12a is put into the peeling machine and the residual third layer of photo resist 5c shown in FIG. 4F is removed by a photo resist peeling liquid. At the same time, the transparent conductive film 12a deposited on the third layer of photo resist 5c is also removed by the peeling process while retaining the transparent conductive film 12a on the passivation layer via holes 20, the source electrode 9, the drain electrode 10 and the passivation layer film in the pixel region to form the source electrode 9a and the pixel electrode 12 shown in FIG. 4G.

Figure 4G:
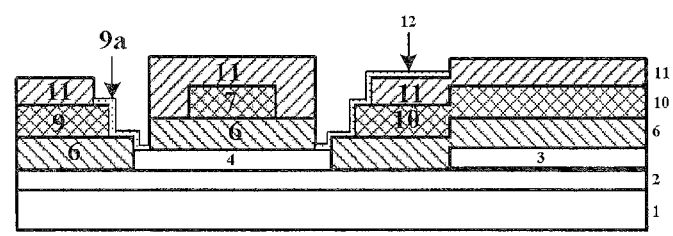
Figure 4H:
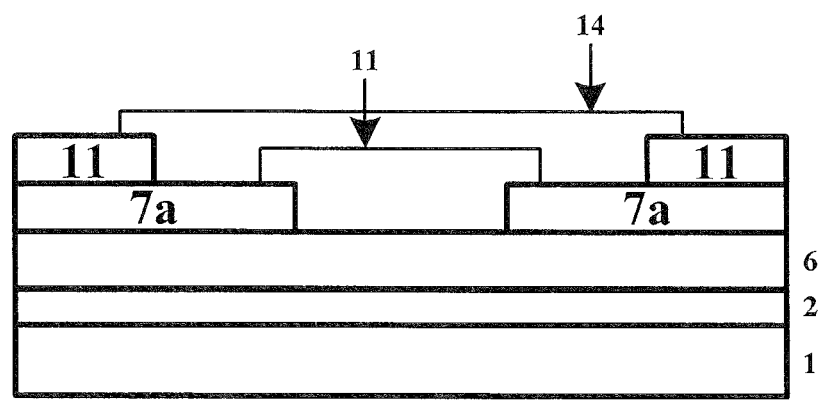

While performing the passivation layer via hole process and the conductive film sputtering and peeling process, the conductive film 14 for connecting the discontinuous gate lines 7a are formed at bridges for the discontinuous gate lines (as shown in FIG. 4H) to finalize the production of the data lines in the entire array. The passivation layer via hole process at the gate lines 7a and the passivation layer via hole process at the source and drain electrodes, as shown in FIG. 4G are performed simultaneously. The deposition and peeling process of the conductive film 14 for connecting the gate lines and the deposition and peeling process of the pixel electrode 12, as shown in FIG. 4G, are also performed simultaneously.

Figure 5:
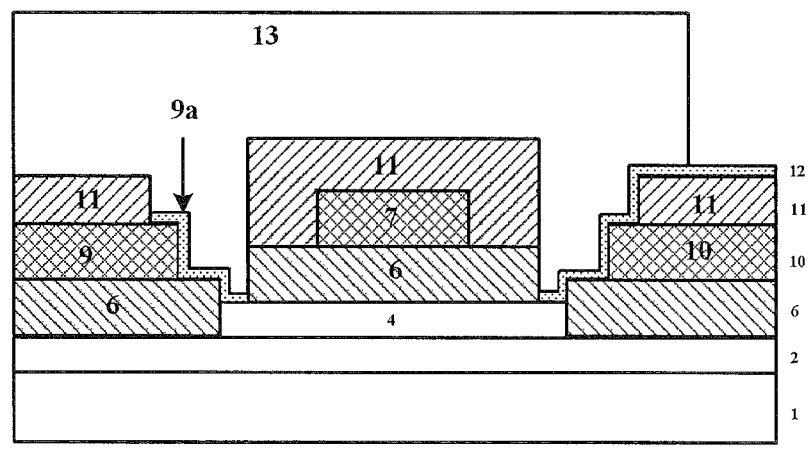
FIG. 5 schematically shows a low temperature polycrystalline silicon field effect thin film transistor array substrate produced on the basis of the process flows shown in FIGS. 4A-4H.

Finally, the patterning process for the pixel definition layer is performed on the array substrate to form the pixel definition layer 13 shown in FIG. 5 to finalize the production of the low temperature polycrystalline silicon field effect thin film transistor array substrate. The pixel definition layer may be formed from the same material as used for the planarization layer, such as acrylic material. It may have a thickness of 1~4 micrometers. The final annealing process is applied to the resultant array substrate by using the rapid thermal annealing or the heat treatment furnace to stabilize the characteristics of the low temperature polycrystalline silicon thin film transistor.

In the method for producing the low temperature polycrystalline silicon field effect thin film transistor array substrate provided by the present disclosure, by means of improving the structure of the low temperature polycrystalline silicon field effect thin film transistor array substrate and using three processes of the semi-transparent mask patterning process, the film peeling process and the deposition process of the gate electrode (gate lines) and the source electrode, and the drain electrode (data lines) in the same layer, the times (i.e., the number) of the lithographic processes for producing the low temperature polycrystalline silicon field effect thin film transistor array substrate may be reduced to 4 so as to improve the yield and reduce the costs due to the reduction of the times of the lithographic processes for producing the low temperature polycrystalline silicon field effect thin film transistor array substrate.

In addition, in the method for producing the low temperature polycrystalline silicon field effect thin film transistor array substrate provided by the present disclosure, the stepped photo resist process and the peeling technique are used to reduce the times of exposure in the lithographic processes for producing the low temperature polycrystalline silicon field effect thin film transistor array substrate and reduce the complexity in process, and thus reduce the process costs while reducing the production process time.

In accordance with another aspect, the present disclosure also provides a low temperature polycrystalline silicon field effect thin film transistor array substrate produced by using the method shown in FIGS. 4A~4H. FIG. 5 schematically shows the low temperature polycrystalline silicon field effect thin film transistor array substrate produced on the basis of the flows shown in FIGS. 4A~4H. In the low temperature polycrystalline silicon field effect thin film transistor array substrate, the gate electrode, the source electrode and the drain electrode are produced by the same layer of metal. The same layer of transparent conductive film for deposition of the pixel electrode connects the respective gate lines together though via holes and also connects the drain electrode with the active layer.

In the low temperature polycrystalline silicon field effect thin film transistor array substrate produced according to the above embodiments, the gate electrode (gate lines) and the source electrode, the drain electrode (data lines) are formed by the same layer of metal film without any interlayer insulation layer insulating them from each other. It has an advantage of reducing the parasitic capacitance between the gate electrode, the source electrode and the drain electrode. The same transparent conductive film as used for the pixel electrode is used to form the source electrode and the drain electrode contacting with the polycrystalline silicon thin film. The connection between the transparent conductive film and the low resistance metal film reduces the resistances of the electrode and wires while the transparent conductive film connects the discontinuous gate line metal film. Only using the SiN film or only using the organic polarization film as the passivation layer, or using the organic polarization film as the pixel definition layer may simplify the array structure and the production process.

In addition, the low temperature polycrystalline silicon field effect thin film transistor array substrate produced according to an embodiment of the present disclosure may be used to produce the low temperature polycrystalline silicon active matrix organic light emitting diode (LTPS-AMOLED).

In accordance with a further aspect of the present disclosure, the present disclosure also provides a display apparatus including the low temperature polycrystalline silicon field effect thin film transistor array substrate as described in any one of the above embodiments. The display apparatus may be any one product or component having the display function, for example, a liquid crystal panel, an electronic paper, an OLED panel, a cell phone, a tablet computer, a TV, a display, a notebook computer, a digital camera frame or a navigator.

In the display apparatus, the gate electrode, the source electrode and the drain electrode are produced by the same layer of metal without any interlayer insulation layers separating the gate electrode from the drain electrode and the source electrode. It has an advantage of reducing the parasitic capacitance between the gate electrode and the source and drain electrodes. The same layer of transparent conductive film for deposition of the pixel electrode connects the respective gate lines through the via hole. The same layer of transparent conductive film for deposition of the pixel electrode also connects the drain electrode with the active layer together, to reduce the resistance of the electrode and wires while the transparent conductive film connects the discontinuous gate line metal film to simplify the array structure and the production process.

The objects, solutions and advantageous effects of the present disclosure have been described in details with reference to the above specific embodiments. It should be understood that the above embodiments are given only by ways of examples instead of limiting the present disclosure. Any changes, equivalent replacement, modification within the spirit and principles of the disclosure can be made by those skilled in the art and should fall within the scope of the present disclosure.

What is claimed is:

1. A method for producing a low temperature polycrystalline silicon field effect thin film transistor array substrate, comprising the steps of: a) using a stepped photo resist process to form a polycrystalline silicon active layer and a lower polar plate of a polycrystalline silicon storage capacitor simultaneously on a substrate in one lithographic process; b) forming a gate insulation layer on the polycrystalline silicon active layer and the lower polar plate of the polycrystalline silicon storage capacitor; c) forming a metal layer on the gate insulation layer and etching the metal layer to form a gate electrode and gate lines connected with the gate electrode, a source electrode, a drain electrode and data lines connected with the source electrode and the drain electrode; d) forming a passivation layer, a photo resist layer and a pixel electrode layer in sequence on the etched metal layer and using stepped patterning and peeling processes to pattern the passivation layer, the photo resist layer and the pixel electrode layer to form patterns of an interlayer insulation layer via hole and a pixel electrode; e) forming a pixel definition layer on the pixel electrode to finalize the production of the low temperature polycrystalline silicon field effect thin film transistor array substrate; wherein the step a) comprises: cleaning the substrate to deposit a layer of SiN film and a layer of $SiO_2$ film sequentially on a surface of the substrate, the SiN film and the $SiO_2$ film constituting a buffer layer; depositing a layer of amorphous silicon film on the buffer layer, dehydrogenating the amorphous silicon film and crystallizing the amorphous silicon film to form the polycrystalline silicon film; cleaning the polycrystalline silicon film and using a semi-transparent mask to form a first layer of photo resist (5a) and a second layer of photo resist (5b) with different thicknesses on a surface of the polycrystalline silicon film, the thickness of the first layer of photo resist (5a) being greater than that of the second layer of photo resist (5b); etching the polycrystalline silicon film to form a film for constituting the polycrystalline silicon active layer and a film for constituting the lower polar plate of the polycrystalline silicon storage capacitor, and then removing the second layer of photo resist (5b) while retaining the first layer of photo resist (5a) as an ion-implantation barrier layer, doping the film for constituting the lower polar plate of the polycrystalline silicon storage capacitor with ions, and then removing the first layer of photo resist (5a) so as to form the polycrystalline silicon active layer and the lower polar plate of the polycrystalline silicon storage capacitor on the substrate simultaneously.

2. The method according to claim 1, wherein the SiN film and the $SiO_2$ film constituting the buffer layer have a thickness of 50 nm~100 nm and a thickness of 100 nm~400 nm, respectively; the amorphous silicon film deposited on the buffer layer has a thickness of 40 nm~100 nm, wherein the amorphous silicon film is dehydrogenated by a heat treatment furnace and crystallized by laser annealing crystallization, metal induced crystallization or solid phase crystallization; the semi-transparent mask is a half-tone or gray-tone mask; the first layer of photo resist (5a) has a thickness of 1-3 micrometers and covers a region of the polycrystalline silicon film for forming the polycrystalline silicon active layer; and the second layer of photo resist (5b) has a thickness of 0.5-1 micrometer and covers a region of the polycrystalline silicon film for forming the lower polar plate of the polycrystalline silicon storage capacitor; etching the polycrystalline silicon film by a plasma process or an inductance coupling plasma process; removing the second layer of photo resist (5b) by a plasma ashing process while retaining the first layer of photo resist (5a) as the ion-implantation barrier layer; doping the film for constituting the lower polar plate of the polycrystalline silicon storage capacitor with ions by an ion implantation process or an ion cloud implantation process, wherein the doping ions are PH3/H2 or B2H6/H2, with an ion implantation dose of 1014 ions/cm2-1016 ions/cm2 and an ion implantation energy of 10 KeV~100 KeV.

3. The method according to claim 1, wherein in the step b), the gate insulation layer is formed on the polycrystalline silicon active layer and the lower polar plate of the polycrystalline storage capacitor by a plasma enhanced chemical vapor deposition process, the gate insulation layer being composed of the $SiO_2$ film and the SiN film formed above the $SiO_2$ film, the $SiO_2$ film having a thickness of 30 nm~100 nm and the SiN film having a thickness of 20 nm~100 nm.

4. The method according to claim 3, wherein the gate insulation layer deposited on the lower polar plate of the polycrystalline silicon storage capacitor is configured to constitute an insulation medium of the polycrystalline storage capacitor.

5. The method according to claim 1, wherein in the step c), the step of forming the metal layer on the gate insulation layer comprises depositing a layer of metal film with a thickness of 200 nm~500 nm on the gate insulation layer by a magnetron sputtering process, and then removing the part of the metal film in the region other than the gate electrode, the gate lines, the source electrode, the drain electrode and the data lines by lithographic and etching processes to form the gate electrode, the gate lines connected with the gate electrode, the source electrode, the drain electrode and the data lines connected with the source electrode and the drain electrode, as well an upper polar plate of the polycrystalline silicon storage capacitor.

6. The method according to claim 5, wherein the metal film is a single-layer metal film composed of Al, Cu, Mo, Ti or AlNd, or a multi-layer metal film composed of Mo/Al/Mo or Ti/Al/Ti;

the data lines connected with the source electrode and the drain electrode are formed by continuous line-shaped metal films, the gate lines are formed by discontinuous line-shaped metal films, and the gate lines are interrupted at crossings of them with the data lines;

the step of etching the metal layer is performed by a wet or dry eroding process;

the lower polar plate of the polycrystalline silicon storage capacitor, the gate insulation layer formed on the lower polar plate of the polycrystalline silicon storage capacitor and an upper polar plate of the polycrystalline silicon storage capacitor constitute the polycrystalline silicon storage capacitor.

7. The method according to claim 1, wherein the step d) comprises:

depositing a layer of medium film on the gate electrode, the source electrode, the drain electrode, the metal gate lines and the data lines by plasma enhanced chemical vapor deposition to form the passivation layer, and then performing a rapid thermal annealing process or heat treatment furnace annealing process to hydrogenate the interior of the polycrystalline silicon active layer and the interface between the polycrystalline silicon film and the $SiO_2$ film by using the SiN film in the passivation layer and the gate insulation layer;

forming a third layer of photo resist (5c) and a fourth layer of photo resist (5d) with different thicknesses on a surface of the passivation layer by means of a semi-transparent mask, the thickness of the third layer of photo resist (5c) being greater than that of the fourth layer of photo resist (5d);

etching the passivation layer and the gate insulation layer under the passivation layer by a plasma process or inductance coupling plasma process to form a passivation layer via hole;

removing the fourth layer of photo resist (5d) while retaining the third layer of photo resist (5c) as a peeling layer;

depositing a layer of transparent conductive film on the passivation layer via hole, the third layer of photo resist (5c), the passivation layer, the source electrode, the drain electrode and an entire surface of the substrate; and removing the third layer of photo resist (5c) and the transparent conductive film deposited on it simultaneously by a peeling process while retaining the transparent conductive film above the passivation layer via hole, the source electrode, the drain electrode and the passivation layer in a pixel area to form the source electrode and the pixel electrode.

8. The method according to claim 7, wherein the passivation layer is a hydrogen-containing SiN film with a thickness of 200 nm~500 nm;

the semi-transparent mask is a half-tone or gray-tone mask;

the third layer of photo resist (5c) has a thickness of 1~3 micrometers and covers the gate electrode, the gate lines connected with it, the source electrode, the data lines connected with it and all of regions other than the passivation layer via hole and the fourth layer of photo resist (5d); the fourth layer of photo resist (5d) has a thickness of 0.5~1 micrometer and covers the drain electrode and adjacent pixel areas;

when the low temperature polycrystalline silicon field effect thin film transistor array uses bottom-emitting active matrix organic light emitting diodes, the transparent conductive film deposited on the passivation layer via hole, the third layer of photo resist (5c), the passivation layer, the source electrode, the drain electrode and an entire surface of the substrate is an oxide transparent conductive film, at least comprising Indium tin oxide, Indium zinc oxide or Tin aluminum oxide, with a thickness of 20 nm~100 nm;

when the low temperature polycrystalline silicon field effect thin film transistor array uses top-emitting active matrix organic light emitting diodes, the transparent conductive film deposited on the passivation layer via hole, the third layer of photo resist (5c), the passivation layer, the source electrode, the drain electrode and an entire surface of the substrate is a composite film, at least comprising ITO/Ag/ITO and IZO/Ag, wherein the ITO film has a thickness of 10 nm~50 nm and the Ag metal film has a thickness of 20 nm~100 nm.

9. The method according to claim 7, wherein forming a conductive film for connecting discontinuous gate lines at bridges for the discontinuous gate lines while performing the passivation layer via hole process, the conductive film deposition and peeling processes to finalize the production of the data lines in the entire array;

the passivation layer via hole process at the gate lines and the passivation layer via hole process at the source and drain electrodes are performed simultaneously, and the deposition and peeling processes of the gate line connection conductive film and the deposition and peeling processes of the pixel electrode are also performed simultaneously.

10. The method according to claim 1, wherein in the step e), the pixel definition layer formed on the pixel electrode is formed by acrylic materials with a thickness of 1~4 micrometers.

11. The method according to claim 1, wherein the step e) comprises: after forming the pixel definition layer on the pixel electrode, further annealing the low temperature polycrystalline silicon field effect thin film transistor array substrate by rapid thermal annealing or a heat treatment furnace to stabilize the characteristics of the low temperature polycrystalline silicon field effect thin film transistor.

* * * * *